United States Patent [19]

Lin

[11] 4,038,488
[45] July 26, 1977

[54] MULTILAYER CERAMIC MULTI-CHIP, DUAL IN-LINE PACKAGING ASSEMBLY

[75] Inventor: Paul T. Lin, Wappingers Falls, N.Y.

[73] Assignee: Cambridge Memories, Inc., Poughkeepsie, N.Y.

[21] Appl. No.: 576,298

[22] Filed: May 12, 1975

[51] Int. Cl.² .............................................. H05K 5/00
[52] U.S. Cl. .............................................. 174/52 FP
[58] Field of Search ............ 174/52 FP; 317/101 CM, 317/101 CP; 357/74, 75

[56] References Cited

U.S. PATENT DOCUMENTS

| | | | |
|---|---|---|---|
| 3,549,784 | 12/1970 | Hargis | 174/52 FP |
| 3,555,364 | 1/1971 | Matcouich | 317/101 D |
| 3,601,522 | 8/1971 | Lynch | 174/52 FP |
| 3,617,817 | 11/1971 | Kawakatsu et al. | 174/52 FP |
| 3,760,090 | 9/1973 | Fowler | 174/52 FP |

*Primary Examiner*—David Smith, Jr.
*Attorney, Agent, or Firm*—Joseph L. Spiegel

[57] ABSTRACT

A multilayer ceramic, multi-chip, dual in-line packaging assembly comprises a ceramic substrate with a pair of semiconductor chip receiving cavities therein. A metalization pattern partially embedded within the substrate provides electrical paths for semiconductor chip devices joined thereto to external circuitry. Semiconductor chips are joined to exposed pads within the chip receiving cavities. Metalization spaced from and positioned beneath the semiconductor chip devices completes interconnections between semiconductor chip devices. Exposed finger areas are spaced from one another and about the semiconductor chip receiving cavities. Embedded lines extend from the finger areas to external circuitry and interconnection means extend between finger areas. Finger areas on one side of a chip receiving cavity are offset with respect to the finger areas on the opposite side of the same chip receiving cavity but aligned with the finger areas on an adjacent chip receiving cavity to minimize crossover connections as well as the electrical coupling. An identical bonding design for each cavity also results. A lead frame is brazed to the substrate at its edges. A lid is bonded to the top surface of the substrate to hermetically seal chips within the chip receiving cavities thereby completing assembly of the package.

11 Claims, 4 Drawing Figures

MULTILAYER CERAMIC MULTI-CHIP, DUAL IN-LINE PACKAGING ASSEMBLY

BACKGROUND OF THE INVENTION

1. Field of the Invention

The present invention relates to electronic packaging. While not so limited, the invention finds immediate application as a multilayer ceramic, multi-chip, dual in-line, packaging assembly for semiconductor memory circuitry in high speed data processing circuits.

2. Description of the Prior Art

At present there are commercially available multilayer ceramic dual in-line packaging assemblies.

Likewise the prior art is replete with multichip packaging assemblies. See, for example, U.S. Pat. No. 3,365,620, issued to J. H. Butler, et al. on Jan. 23, 1968; U.S. Pat. No. 3,525,617, issued to K. C. A. Bingham on Aug. 25, 1970; and, U.S. Pat. No. 3,777,221, issued to P. A. Tatusko, et al. on Dec. 4, 1973.

Heretofore attempts at a multilayer ceramic, multi-chip, dual in-line, packaging assembly have met with limited success due to difficulties in achieving requisite circuit density.

Summary of the Invention

Accordingly an object of the invention is a reliable, multilayer ceramic, multi-chip dual in-line packaging assembly of high circuit density.

A feature of the invention is the provision of a multilayer ceramic, multi-chip, dual in-line packaging assembly with a partially embedded metalization pattern that includes a level spaced from and positioned beneath the semiconductor chip devices of said packaging assembly for completing interconnections therebetween.

Another feature is the provision of a level of metalization which fans out from finger areas to external circuitry and that includes interconnection means between finger areas.

Still another feature of the present invention is the provision at the same level as that to which semiconductor chip devices are joined of interlevel interconnection means and lead lines extending from said interlevel interconnection means to external circuitry.

A further feature of the invention is the provision of finger areas on one side of one of the chip receiving cavities that are offset with respect to the finger areas on the opposite side of the same chip receiving cavity, but aligned with the finger areas of an adjacent chip receiving cavity so as to minimize cross-over connections as well as the electrical coupling.

BRIEF DESCRIPTION OF THE DRAWING

The foregoing and other objects, features and advantages of the invention will be apparent from the following more particular description of the preferred embodiment of the invention, as illustrated in the accompanying drawing, wherein.

DESCRIPTION OF THE PREFERRED EMBODIMENTS

Figure 1:
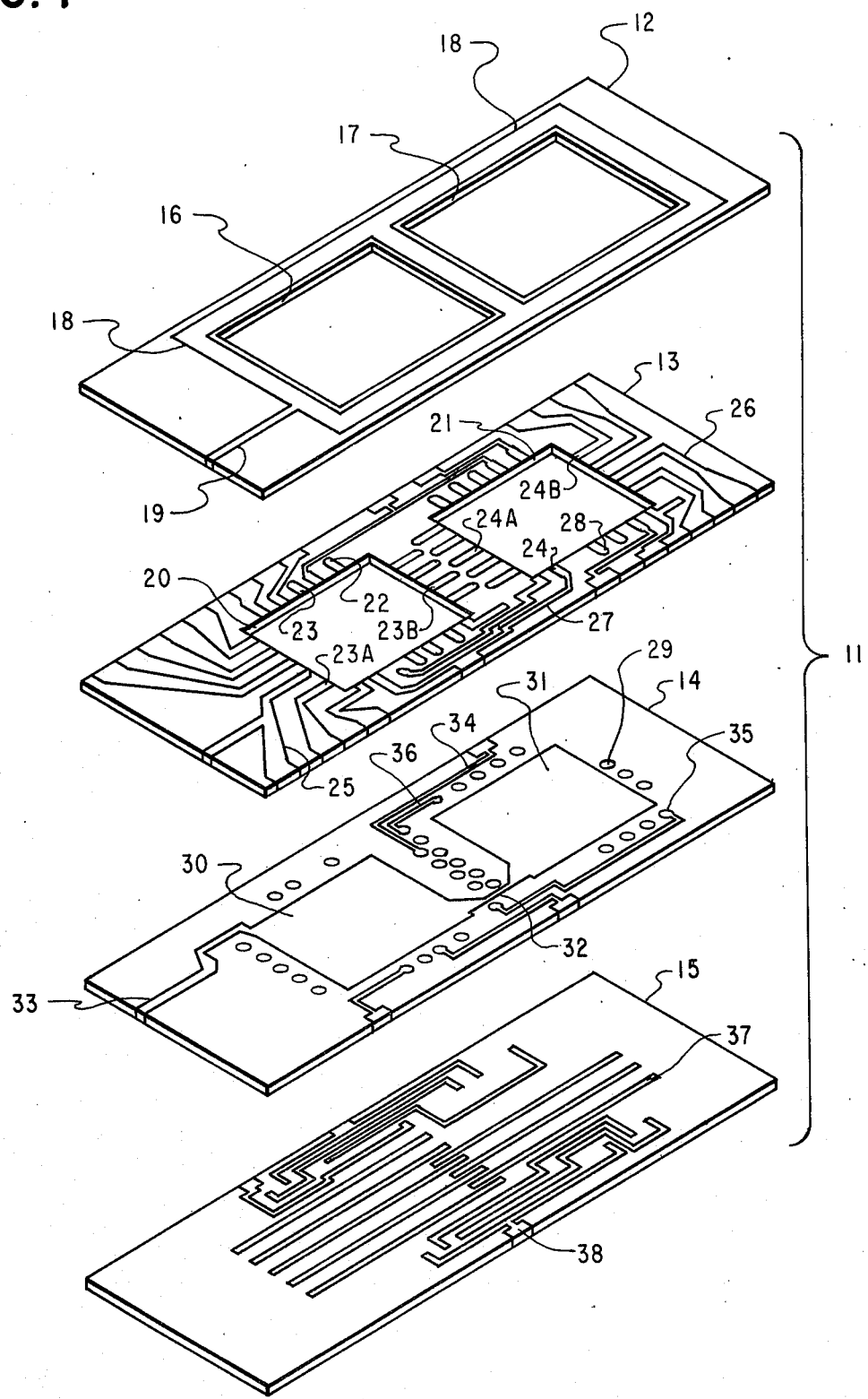
FIG. 1 is an exploded perspective view of the ceramic substrate of the multilayer ceramic multi-chip packaging assembly of the present invention.
Figure 2:
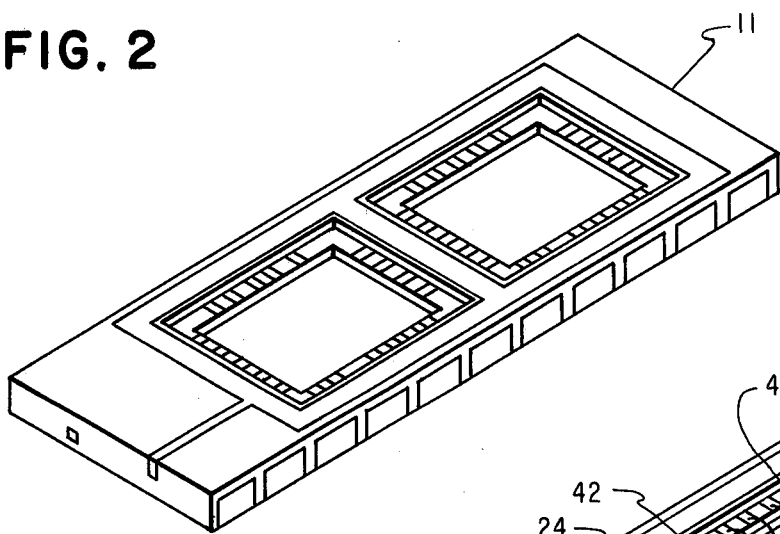
FIG. 2 is a perspective view of the substrate of FIG. 1 after lamination and firing.

Referring now to the drawing, a multilayer ceramic, multi-chip, dual in-line packaging assembly constructed in accordance with the teachings of the present invention will be described.

Referring first to FIG. 1, the package is seen as including four sheets of green ceramic material 12, 13, 14, 15, that will be punched, metalized, laminated together and sintered to form a dense, multilayer ceramic substrate 11. A wide variety of ceramic raw materials may be used, for example, alumina, zircon, aluminum silicates, titanium dioxide, etc., and various combinations thereof, but typically 94% $Al_2O_3$ is preferred. Each sheet of ceramic material is cut from a ceramic tape. The sheets are punched to form cavities or via holes and then metalized for hermetic purposes and to form conductors.

Figure 4:
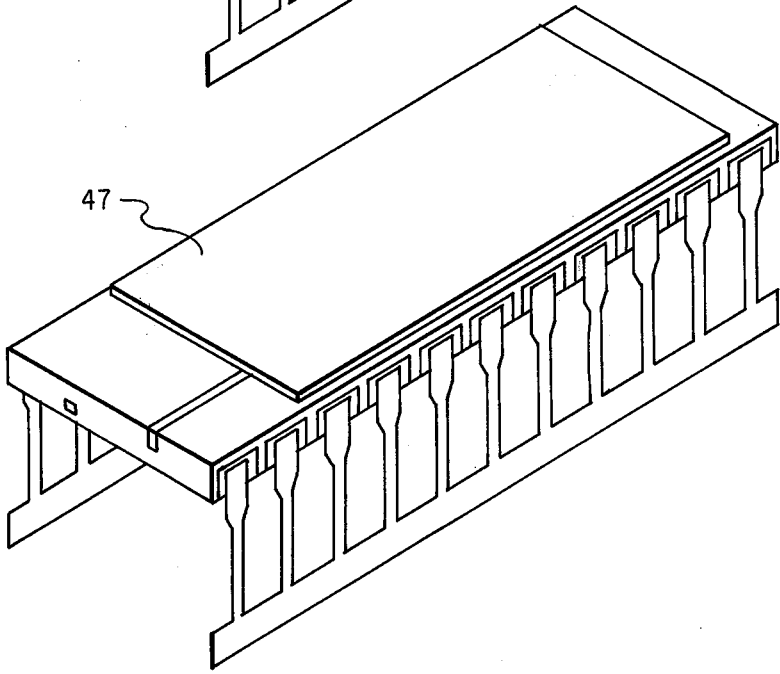

The top layer 12 is provided with a pair of rectangular openings 16, 17, for providing access to the cavities to be formed within the substrate 11. A continuous conductive layer 18, as of moly-tungsten, and which includes a ground lead 19, is deposited, as by silk screening, on the top surface of layer 12. After sintering this paste yields good conductivity and adheres well to the ceramic. In a subsequent operation the substrate 11 may be capped with a metallic lid (see FIG. 4) to form hermetically sealed cavities within substrate 12. The lid will then be joined, as by welding, to the layer 18. However, non-metallic lids, as of ceramic, plastic, etc., may also be used, in which case conductive layer 18 with its ground lead 19 may be omitted. The lead 19 extends to the edge of layer 12 and serves to ground any metal lid used.

The next layer 13 is also provided with a pair of rectangular openings 20, 21 aligned with but of smaller dimension than the openings 16, 17 in the top layer 12. In a typical embodiment these openings are 260 mils by 330 mils. Via holes 22 extend through layer 13 for providing passageways leading to other layers. Metalization, as of moly-tungsten, is applied, as by silk screening, to the top surface of layer 13 and squeezed within the via holes 22 to form: fingers 23, 24; lead lines 25, 26 to the edges of layer 13; interconnections 27 between fingers 23, 24; and, interconnection deposited within via holes as at 28 for electrically joining circuitry on different layers. When the lead lines are screened down, sufficient paste is put down to run over the edges. In a subsequent operation contact leads will be joined to the metalization at the edges.

It should be noted that the metalization pattern on layer 13 fans out from the fingers 23, 24 to the edge of layer 13 ultimately to be connected via leads to external circuitry. A feature of the invention, however, is that the pattern is also used to interconnect between fingers, as at 27.

The openings 20, 21 in layer 13 are aligned along a longitudinal axis of the layer 13. The fingers 23, 24 surround the openings 20, 21 but those fingers which run parallel to the longitudinal axis on one side of the openings 20, 21 as to 23A, 24A, are staggered or offset with respect to the fingers that run parallel to the longitudinal axis on the opposite side of the openings as at 23B, 24B. Further, fingers 23A are aligned longitudinally with fingers 24A, while fingers 23B are aligned longitudinally with fingers 24B. Through this arrangement of staggering or offsetting the finger areas about the chip receiving cavities, the number of required crossover connections is greatly minimized. Electrical coupling is likewise minimized. Bonding of leads is facilitated. There is an identical bonding design for each cavity. In a typical embodiment the fingers are 10–15 mils wide and spaced 20–30 mils apart.

The next layer 14 is provided with via holes 29 which extend through layer 14 for providing passageways extending therethrough. Metalization, as of moly-tungsten, is applied, as by silkscreening, to the top surface of layer 14 to form: chip joining pads 30, 31; interconnection 32 between pads 30, 31; pad ground lead line 33 to the edge of layer 14; lead lines 34 to the edge of layer 14; interconnections deposited within via holes as at 35 for electrically joining circuitry on different layers; and, interconnections 36 between via hole interconnections. Thus, the metalization at the layer 14 is seen to provide the joining areas 30, 31 for chips, interlevel interconnection means as at 35 and lead lines as at 34 to external circuitry.

The bottom layer 15 is provided with metalization, as of moly-tungsten, applied as by silk screening to form: interconnections 37 between via hole interconnections from higher layers and, as at 38 leading to the edge of layer 15. Where additional wiring pattern is required, the pattern may be screened on the back side of layer 15, joined to the remainder of the pattern as by via hole connections or some other form of interlevel connection means and covered with a slip of ceramic material.

In subsequent operations, the layers 11–15 are aligned, laminated together and fired to form a dense ceramic body 11 with an electrical interconnection system partially exposed and partially embedded within body 11.

Figure 3:
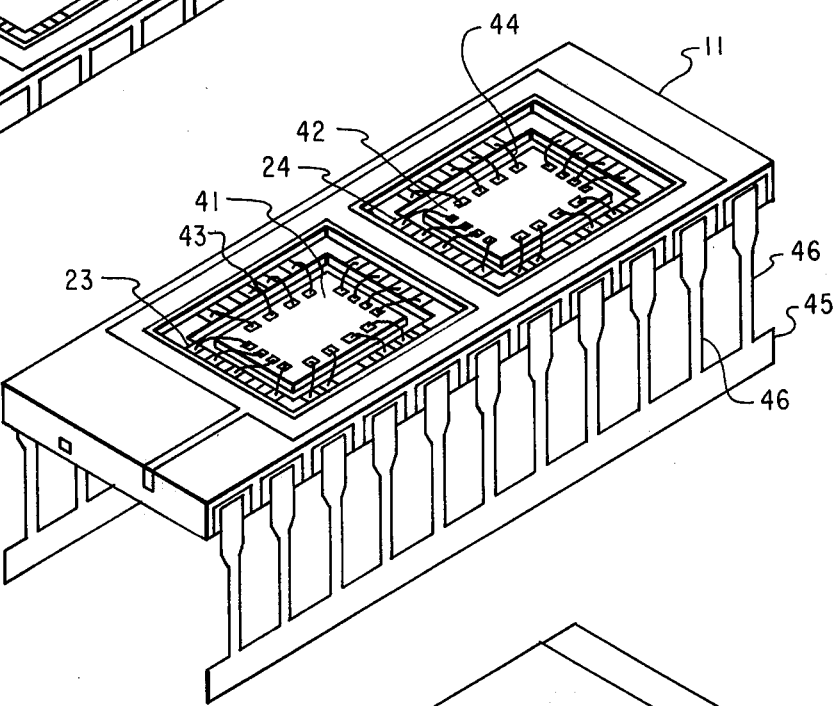
FIG. 3 is a perspective view of the substrate of FIG. 2 after lead and chip joining; and, FIG. 4 is a perspective view of the completed packaging assembly of the present invention.

Referring now to FIG. 3, semiconductor integrated circuit chip devices 41, 42 are bonded to the chip joining pads 30, 31. Wires 43, 44 are bonded between fingers 23, 24 and the contacts or terminals of chip devices 41, 42. Ultrasonic or thermo-compression bonding may be employed. Prior to chip joining a lead frame 45 including leads 46 is bonded, as by brazing to the metalization at the edges of body 11 and for completing conductive paths from the electrical interconnection system of the ceramic body 11 to external circuitry. The leads 46 serve not only to provide electrical connection to external circuitry, but also to provide interlevel connection between the metalization on different layers thereby minimizing the number of via hole connections required. In the illustrated embodiment side brazed leads are shown, although in appropriate cases bottom brazed or top brazed leads may be utilized. Further, in the so-called leadless connector systems where socket clamps are employed the leads may be omitted.

In the final operation a lid 47 is bonded to the top surface of body 11 to hermetically seal the chips 41, 42 within the cavities formed within body 11. The lid 47, when metal, may be of Kovar[x] plates with gold. This completes assembly of the package. It is now ready for use in a high speed data processing system.

While the invention has been particularly shown and described with reference to the preferred embodiments thereof, it will be understood by those skilled in the art that various changes in form and detail may be made without departing from the spirit and scope of the invention.

What is claimed is:

1. A multilayer ceramic, multi-chip packaging assembly comprising:
a ceramic substrate having at least a pair of semiconductor chip receiving cavities therein;
a metalization pattern partially embedded within said substrate for providing electrical paths for semiconductor chip devices joined thereto to external circuitry;
said pattern including a first level having at least a pair of exposed pads for joining semiconductor chips thereto;
at least a pair of semiconductor chip devices joined to said joining pads within said semiconductor chip receiving cavities;
said pattern further including a second level above said first level, said second level including
exposed finger areas spaced from one another and about said semiconductor chip receiving cavities, and
leads extending between said finger areas and semiconductor chip terminals of said semiconductor chip devices within said semiconductor chip receiving cavities;
said finger areas on one side of one of said chip receiving cavities being offset with respect to said finger areas on the opposite side of said one of said chip receiving cavities; and,
said offset finger areas on one side of said one of said chip receiving cavities being aligned with finger areas on one side of another of said chip receiving cavities.

2. The invention defined by claim 1 wherein said pattern includes a third level spaced from and positioned beneath said semiconductor chip devices for completing interconnections between said semiconductor chip devices.

3. The invention defined by claim 1 wherein said first level pattern includes means for electrically connecting to external circuitry.

4. The invention defined by claim 1 including embedded means for electrically interconnecting said first and second levels.

5. The invention defined by claim 1 wherein said second level pattern includes means for electrically connecting to external circuitry.

6. The invention defined by claim 1 wherein said second level includes embedded lead lines extending from said finger areas for electrically connecting to external circuitry.

7. The invention defined by claim 1 including embedded means for electrically interconnecting said first and second levels.

8. The invention defined by claim 1 including electrical interconnection means between finger areas.

9. The invention defined by claim 1 wherein said first level of said metalization pattern includes means for interconnecting to said second and third levels and further includes lead lines extending from said interlevel interconnection means to external circuitry.

10. The invention defined by claim 1 including leads along at least one edge of said substrate.

11. The invention defined by claim 1 including means for hermetically sealing said semiconductor chip devices within said cavities.

* * * * *